US006953985B2

(12) United States Patent
Lin et al.

(10) Patent No.: US 6,953,985 B2
(45) Date of Patent: Oct. 11, 2005

(54) WAFER LEVEL MEMS PACKAGING

(75) Inventors: Jong-Kai Lin, Chandler, AZ (US); William H. Lytle, Chandler, AZ (US); Owen Fay, Gilbert, AZ (US); Steven Markgraf, Chandler, AZ (US); Henry G. Hughes, Scottsdale, AZ (US); Craig Amrine, Tempe, AZ (US); Ananda P. De Silva, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 56 days.

(21) Appl. No.: 10/170,184

(22) Filed: Jun. 12, 2002

(65) Prior Publication Data

US 2003/0230798 A1 Dec. 18, 2003

(51) Int. Cl.[7] ............................................. H01L 23/552
(52) U.S. Cl. ...................................... 257/659; 257/704
(58) Field of Search ................................. 257/659, 660, 257/704, 708, 710; 438/106, 121, 125

(56) References Cited

U.S. PATENT DOCUMENTS

| 6,242,842 | B1 | * | 6/2001 | Pahl et al. | ............... | 310/313 R |
| 6,323,550 | B1 | * | 11/2001 | Martin et al. | ............... | 257/704 |
| 6,504,256 | B2 | * | 1/2003 | Shah et al. | .................. | 257/778 |
| 6,624,003 | B1 | * | 9/2003 | Rice | ........................... | 438/106 |
| 6,667,549 | B2 | * | 12/2003 | Cahill | ......................... | 257/728 |
| 2004/0067604 | A1 | * | 4/2004 | Ouellet et al. | .............. | 438/108 |

* cited by examiner

Primary Examiner—David A. Zarneke

(57) ABSTRACT

An exemplary method and apparatus for MEMS device wafer level and/or array packaging comprises inter alia an EM shielding array of dielectric lid elements (340) sealed to a MEMS device die array (300) to produce a sealed MEMS device package array (330). Disclosed features and specifications may be variously controlled, adapted or otherwise optionally modified to improve hermetic sealing and/or EM shielding for any MEMS device. An exemplary embodiment of the present invention representatively provides for wafer level packaging of RF MEMS switches prior to device singulation.

29 Claims, 4 Drawing Sheets

WAFER LEVEL MEMS PACKAGING

FIELD OF INVENTION

The present invention generally relates to MEMS device fabrication and more particularly, in one representative and exemplary aspect, to wafer level packaging of RF MEMS devices prior to wafer dicing.

BACKGROUND

In general, microelectromechanical systems (MEMS) are miniature devices combining both electrical and mechanical components that are typically fabricated with batch-processing techniques borrowed from integrated circuit (IC) manufacturing technology. See, for example, J. Bryzek et al., "Micromachines on the March", *IEEE Spectrum Mag.*, May 20, 1994. Examples of representative MEMS devices include: accelerometers; optical switches; gyroscopes; sensors and actuators. Integrated MEMS (IMEMS) generally combine IC's with MEMS devices on a substantially unitary substrate. In either case, MEMS and IMEMS devices are usually adapted to employ spatially active elements (i.e., gears, pivots, hinges, levers, slides, etc.) which typically must be free to move in order to function for their intended purpose.

Development of MEMS technology has generally been driven by ontological advancements in the commercial electronics industry along with increasing demand for sophisticated devices having reduced parts count, weight, form factors and power consumption while improving or otherwise maintaining overall device performance. In particular, application of MEMS technology to RF and microwave component design has met with considerable success in the areas of systems integration and the development of novel architectures directed to achieving many of these aims at relatively low fabrication cost.

With the potential to enable wide operational bandwidths and the reduction of interconnect losses to near negligible levels, MEMS technology has been projected to provided on-chip switches with virtually zero standby power consumption and nano-Joule switching with low voltage actuation. Other representative applications include the production of high stability (e.g., "quartz-like") oscillators and high performance miniaturized components, such as, for example, capacitors, inductors, filters and the like.

Representative technologies employing MEMS devices in RF applications include, for example: mobile phone and wireless communications; wireless Internet access; wireless data devices, such as various Bluetooth® compliant peripherals; and location services (i.e., GPS). For a general discussion of RF MEMS technology, see, for example, Elliot R. Brown, "RF-MEMS Switches for Reconfigurable Integrated Circuits", *IEEE* 0018-9480/98, 1998; and Sergio P. Pacheco et al., "Design of Low Actuation Voltage RF MEMS Switch", *IEEE* 0-7803-5687-X/00, 2000.

There are several MEMS fabrication techniques currently in commercial use, including, for example, bulk micromachining, surface micromachining, fusion bonding and LIGA (e.g., X-ray lithographic electroforming). In bulk micromachining, 3D structures are generally sculpted within the confines of a substrate by exploiting anisotropic etching rates of different atomic crystallographic planes in the substrate. Alternatively, structures may be formed by a process of fusion bonding, which generally involves building-up a structure by atomically bonding various substrates to one another. In surface micromachining, 3D structures are typically built-up by the addition and removal of a sequence of film layers to and from a substrate surface which are generally termed "structural" and "sacrificial" layers, respectively. The success of the surface micromachining approach usually is proportional to the ability to release or dissolve the sacrificial layers while preserving the integrity of the structural elements. In the LIGA process, relatively thick photoresists are exposed to X-rays in order to produce molds that are subsequently used to form high aspect ratio electroplated 3D structures. However, to date, the most widely used technique for RF MEMS manufacture has been surface micromachining.

In general, surface micromachining consists of the deposition and lithographic patterning of various films—usually on silicon substrates. Typically, the procedure involves making one or more "release" films over a specific region of the substrate wherein the films are suitably adapted for subsequent release of patterned structures therein to permit mechanical motion and/or actuation of the developed MEMS structural elements. This may be accomplished, for example, by depositing a "sacrificial" film below the released ones, which may be removed near the end of the process by selective etching. Various materials may be employed for the deposition of release and/or sacrificial layers, including, for example: metals (i.e., Au, Al, etc.); ceramics ($SiO_2$, $Si_3N_4$, SiC, AlN, etc.) and plastics (photoresist, polymethyl methacrylate (PMMA), etc.). Depending on the process design specifications and the presence of other materials present in the film stack, the release and sacrificial layers may be deposited by evaporation, sputtering, electrodeposition or other methods well-known in the art.

More recent developments in surface micromachining methods have been realized with the application of dry etching techniques; particularly reactive-ion etching (RIE). By mixing reactive chemicals in a plasma stream and exposing a substrate with films deposited thereon, certain materials on the surface may be selectively etched at relatively high rates. For example, chlorine-bearing compounds in a high density plasma have been observed to yield nearly isotropic silicon etching with a selectivity of $Si:SiO_2$ of better than 100:1.

On the other hand, low-pressure plasma etching (e.g., inductively coupled plasma (ICP)) generally permits bulk micromachining of mechanical structures directly in silicon, quartz or other substrates by selectively removal of substrate material. Low-pressure plasma etching is generally believed to be the most mature of the micromachining technologies and has been used for several years in the manufacture of a variety of sensors and actuators such as pressure sensors, accelerometers and ink-jet nozzles. The process also may include the steps of wet chemical etching and/or RIE to form released microstructures. With wet etching, the resulting structures generally depend on the directionality of the etch, which is usually a function of the crystallinity of the substrate as well as the etching chemistry. Accordingly, the spatial features of the resulting microstructures become a convolution of the etch-mask pattern with the etching directionality. Hence, the narrow deep microstructures generally desired in bulk micromachining are often difficult to achieve and better results may often be achieved with RIE techniques. One relatively common RIE bulk micromachining technique is known as single-crystal reactive etching and metalization (SCREAM), which has been used to make comparatively deep microstructures in silicon and GaAs. See, for example, K. A. Shaw et al., *Sens. Actuators,* 40, 1994; and Z. L. Zhang and N. C. MacDonald, *J. Microme-*

*chanical Syst*, 2, 66–72, 1993. The SCREAM process has generally demonstrated the capability to produce structures having aspect ratios up to 50 or more which span over lateral dimensions of up to about 5 mm.

As is generally well-known, good fabrication and packaging techniques are relatively important for the successful performance of conventional RF or microwave components. Generally speaking, this may be even more critical in the case of the fabrication and packaging of MEMS devices. Indeed, in addition to aiding with the reduction of unwanted resonances and electromagnetic (EM) interference and/or coupling, conventional MEMS packaging methods generally aim to prevent moisture and various particulate contaminants which may prevent or otherwise impede the movement of freestanding MEMS structures or otherwise may be responsible for other energy losses (i.e., acoustic, thermal, etc.). The two most commonly employed MEMS packaging techniques to date have been the "flip-chip" and the "self-packaging" methods. See, for example, David C. Miller et al., "Microrelay Packaging Technology using Flip-Chip Assembly", *The Thirteenth Annual International Conference on Micro Electromechanical Systems*, 265–270, *IEEE* 0-7803-5273-4/00; and S. V Robertson et al., "Micromachined Self-packaged W-band Bandpass Filters", *IEEE MTT-S International Microwave Symposium Digest*, 1543–1546, 3, 1995.

Conventional MEMS dies are typically fabricated with wirebond pads and utilize a variety of sealing mechanisms. For example, a cap may be provided with a cavity etched for receiving a micromachined device structure therein. The cap may be attached to the die by an adhesive. The die and cap may be assembled on, for example, a ceramic substrate where the bond pads of the die are wirebonded to bond pads of the ceramic. Thereafter, the ceramic assembly may then be encapsulated within a hermetic package.

As a result, conventional MEMS packaging systems and methods suffer from several problems. For example, wirebonds are generally fragile and susceptible to damage during mechanical assembly of the package. Additionally, if any of the microcomponents prove defective, the entire circuit lot must generally be discarded. Moreover, MEMS structures typically contain various metal elements on their surfaces which usually may not be passivated through conventional processes; however, most device packages generally must still be hermetically sealed. Accordingly, previous attempts at packaging MEMS devices have met with substantial difficulties in producing reliable electrical connections and/or hermetic seals capable of withstanding manufacturing process stress while maintaining or otherwise reducing production costs.

For many conventionally produced MEMS components, the steps of packaging and testing may account for between about 70–95% of the total fabrication cost. Existing semiconductor packaging methods, although generally less expensive, have not yet been adequately adapted for successfully extensible application to MEMS fabrication with commercially acceptable yields and/or reliability. Despite the efforts of prior art designs, none have yet realized reliable wafer level packaging of MEMS device arrays that are readily manufacturable at low cost. Accordingly, a representative limitation of the prior art concerns inter alia the effective and efficient wafer level packaging of MEMS devices prior to wafer dicing and device singulation.

SUMMARY OF THE INVENTION

In various representative aspects, the present invention provides a system and method for wafer packaging which may be used to encapsulate and hermetically seal MEMS devices fabricated on a wafer substrate before dicing of the wafer into individual MEMS chips. In one exemplary aspect, a representative packaging element is disclosed as comprising a dielectric lid array suitably adapted to substantially shield MEMS device components from EM energy incident to individually sealed MEMS packages and/or EM energy leakage from individually sealed MEMS packages. The disclosed system and method may be readily adapted for wafer level packaging of any type of MEMS device and in one representative aspect, the present invention may specifically embody a device and/or method for packaging of RF MEMS switches.

One representative advantage of the present invention would allow MEMS devices to be tested, for example, in a wafer level encapsulated environment prior to device singulation. Such early testing and subsequent elimination of "bad" device elements would serve, for example, to minimize further processing which may otherwise be wasted on bad devices. Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWINGS

Representative elements, operational features, applications and/or advantages of the present invention reside inter alia in the details of construction and operation as more fully hereafter depicted, described and claimed—reference being had to the accompanying drawings forming a part hereof, wherein like numerals refer to like parts throughout. Other elements, operational features, applications and/or advantages will become apparent to skilled artisans in light of certain exemplary embodiments recited in the detailed description, wherein:

Figure 1:
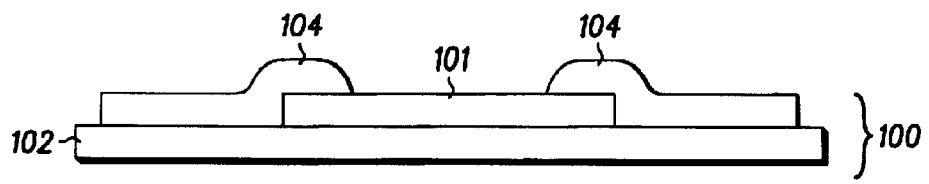
FIG. 1 illustrates a partial cross-sectional view of a representative substrate for fabrication of a device packaging element in accordance with an exemplary embodiment of the present invention.

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention.

DETAILED DESCRIPTION OF EXEMPLARY EMBODIMENTS

The following descriptions are of exemplary embodiments of the invention and the inventors' conceptions of the best mode and are not intended to limit the scope, applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the essence and scope of the invention.

Various representative implementations of the present invention may be applied to any microelectromechanical system and/or method. Certain representative implementations may include, for example: RF shielding of discrete RF MEMS devices; RF shielding of arrays of RF MEMS device elements; wafer level hermetic packaging of MEMS devices; and wafer level testing and/or processing of sealed MEMS device arrays.

As used herein, the terms "electromagnetic energy", "EM energy", "RF energy", "energy", "radiation", and any variations thereof, may generally be used interchangeably and may also be understood to comprise at least one of particle beam radiation, particle radiation (e.g., DeBroglie radiation in accordance with the DeBroglie wavelength λ of a mass m traveling at a velocity v in accordance with the expression $$\lambda = \frac{h}{mv}),$$

wave radiation, wave-packet radiation, electromagnetic radiation and/or any other radiative energy now known or hereafter described by those skilled in the art. As used herein, the terms "microelectromechanical systems/structures", "MEMS", "IMEMS", "micromachined structures" and any variations thereof, may generally be understood to comprise any miniature device combining, or otherwise capable of being suitably adapted to combine, both electrical and mechanical components that may be at least partially fabricated with batch-processing techniques. Moreover, the terms "MEMS", "IMEMS", "micromachined structures", "microelectromechanical systems/structures" and any variations thereof may also be generally understood to comprise any miniature electromechanical device generally requiring at least temporary protection of spatially active elements during, for example, device packaging; whether such devices are now known or hereafter developed or otherwise described in the art. Such microelectromechanical devices may be sealed or otherwise optionally configured for at least partial exposure to their operating environment; such as in the case of, for example, microsensor devices. Additionally, use of the term "microelectronic" may generally be understood to refer to any miniature electronic device and/or component that may or may not exhibit microelectromechanical properties; for example, transistors of an IC element may be understood to comprise "microelectronic" devices that are generally not "microelectromechanical" (i.e., IC transistors generally do not comprise spatially active elements) while RF MEMS switches may be understood to comprise "microelectromechanical" devices that generally may also be classified as "microelectronic" in nature. Use of the term "plastic" is intended to include any type of flowable dielectric material. The term "film" may be used interchangeably with "coating" and/or "layer", unless otherwise indicated. The terms "released MEMS elements", "spatially active regions", "sensitive areas", and "active MEMS elements" may be used interchangeably to refer to any freely movable structural elements, such as, for example, gears, pivots, hinges, levers, sliders, etc., as well as exposed active elements (e.g., flexible membranes for microsensors; e.g., chemical, pressure, and/or temperature microsensors).

A detailed description of an exemplary application, namely a system and method for array packaging of RF MEMS devices, is provided as a specific enabling disclosure that may be generalized by skilled artisans to any application of the disclosed system and method for MEMS device packaging in accordance with various embodiments of the present invention. Moreover, skilled artisans will appreciate that the principles of the present invention may be employed to ascertain and/or realize any number of other benefits associated with MEMS device packaging such as, but not limited to: improvement of S/N in an RF MEMS device; reduction in total MEMS fabrication cost; improved process control in accordance with, for example, wafer level testing and tolerance discrimination prior to MEMS device singulation and any other applications and/or benefits currently known or hereafter described in the art.

MEMS Devices

As described vide supra, interest in MEMS devices generally may be attributed inter alia to their potential for demonstrating low insertion loss, high isolation and high linearity. Several device designs, based on a number of configurations, actuation mechanisms and topologies, have been developed; for example: the cantilever; membrane; shape-memory alloy; multi-pole/multi-throw and the like. The present invention may be employed with any type of microelectromechanical device and/or actuation mechanism now known or hereafter described in the art. For example, representative MEMS actuation mechanisms may include:

- Electrostatic: wherein positive and/or negative charges, set by applied voltages between certain structural elements cause coulombic forces to produce motion;
- Piezoelectric: wherein, applied voltages on structural elements induce fields in order to change the spatial dimensions of structural elements;
- Thermal: wherein current flow through a structural element causes the structural element to heat up and spatially expand;
- Magnetic: wherein magnetically-induced or electronically-induced magnetic forces communicate motion; and
- Bi-metallic (e.g., shape-memory alloy): wherein certain materials, upon experiencing spatial deformation at a first lower temperature, demonstrate the ability to substantially return to their original un-deformed shape upon heating to a second higher temperature.

Unlike IC's, the diverse nature of MEMS technology complicates packaging related issues. MEMS device packages may contain many electrical and/or mechanical components. Generally, in order for such devices to be useful, the MEMS functional elements typically require interconnections. These electrical circuits generally must be supplied with electrical energy which may be consumed or transformed into mechanical and/or thermal energy. Because MEMS systems often are observed to operate best within certain temperature ranges, good packaging techniques should generally offer adequate means for heat dissipation. An additional complication arises from the fact that a MEMS device die diced from a wafer may be quite fragile and therefore must be protected from mechanical damage and/or hostile environments.

Often, it may be necessary to encapsulate MEMS devices in some form of hermetically sealed package so as to prevent damage. Accordingly, it would be desirable to encapsulate MEMS devices at the wafer level before separation into individual chips. This would avoid inter alia damage to unprotected spatially active elements which may occur during the separation and/or packaging process. Ideally, wafer level encapsulation would provide suitably adapted protection to allow the use of simple and inexpensive separation and/or packaging methods such as, for example, wafer sawing and integrated pre-singulation device testing.

Conventional MEMS packaging methods may be generally categorized as either integrated processes or wafer bonding processes. Integrated processes generally establish MEMS encapsulation as one of the goals of various micromachining techniques such that several additional fabrication steps, including deposition, patterning and etching, are often required in order to manufacture "micro-shells" for protection of MEMS structures. Typical examples include: reactive sealing of vibratory micromachined beams (see, for example, J. J. Sniegowski et al., "Performance Characteristics of Second Generation polysilicon Resonating Beam Force Transducers", *IEEE Solid-State Sensor and Actuator Workshop, Hilton Head Island,* 9–12, 1990); epitaxial silicon caps for sealing microstructures (see, for example, K. Ikeda, H. Kuwayama et al., "Silicon Pressure Sensor with Resonant Strain Gages Built into Diaphragm", *Digest of the 7th Sensor Symposium,* 55–58, 1988); silicon nitride shells for sealing mechanical resonators for use in wireless communication applications (see, for example, Liwei Lin et al., "Microelectromechanical Filters for Signal Processing", *IEEE/ASME Journal of Microelectromechanical Systems,* 7, 286–294, September 1998); and various fabrication technologies for embedding microstructures and CMOS circuitry (see, for example, J. Smith et al., "Characterization of the Embedded Micromechanical Device Approach to the Monolithic Integration of MEMS with CMOS", *SPIE,* 2879, October 1996).

Wafer bonding processes, on the other hand, typically use fusion bonding, anodic bonding, eutectic bonding or solder bonding methods in order to encapsulate MEMS structures by using, for example, a second substrate of silicon, glass or other material. Unfortunately, integrated processes also often suffer from drawbacks relating to process-dependency and are generally not suitable for post-processing. Wafer bonding processes have also been observed to generally require temperature processing and substantially flat planar surfaces for bonding. Accordingly, no universal process suitably adapted for low cost wafer level MEMS packaging has previously been developed.

MEMS Device Packaging

In general, a MEMS package serves to integrate substantially all of the components typically required for a microelectromechanical system application so as to minimize bulk size, form factor, cost, mass and complexity and also usually provides an interface between the components and the overall system. Due to the mechanical nature of MEMS devices, the requirement to support and protect the MEMS structural elements from thermal and/or mechanical shock, vibration, high acceleration, particles or other physical damage during storage and operation often becomes important.

Other important parameters are thermal resistance of the carrier and the material's electrical and/or chemical properties (i.e., resistance to corrosion). Once a MEMS device is supported on a carrier die (e.g., a chip), wirebonds or other electrical connections may then be made. The composite assembly generally must thereafter be protected from scratches, particulates and/or other physical damage. This may be accomplished, for example, by adding walls and a cover to the base or by encapsulating the assembly, for example, in plastic or other material. Since the electrical connections to the package are often made through the walls, the package walls are typically made from glass or ceramic. The glass or ceramic may also be used to provide electrical insulation of the leads as they protrude through, for example, a conducting package wall.

Many MEMS devices are designed to measure or otherwise detect analytes in a particular environment. Such devices may include biological 'sniffers' or chemical MEMS sensors that measure concentrations of certain types of chemical species. Accordingly, the traditional hermeticity that is generally required for protecting microelectronic devices may not apply to all MEMS devices. Non-hermetically sealed devices may be directly mounted to a printed circuit board (PCB) or even a ceramic substrate with, for example, an analyte permeable housing to protect them from mechanical damage.

Many environmental contaminants may cause corrosion or other physical damage to the metal lines of MEMS devices as well as other components in a MEMS package. For example, moisture may be introduced into the device package during fabrication and before sealing. The susceptibility of MEMS devices to moisture damage is generally dependent on the materials used in their manufacture. For example, aluminum (Al) lines may corrode quickly in the presence of moisture, whereas gold (Au) lines degrade more slowly, if at all. Junctions of dissimilar metals may corrode in the presence of moisture. Additionally, moisture may be readily absorbed by some materials used in fabrication, die attachment or within the MEMS package itself. This absorption may cause swelling, stress or even possibly delamination. In order to minimize these undesirable effects, MEMS packages may often be hermetically enclosed with their bases, sidewalls and lids constructed from materials that provide substantial barriers to liquids and/or gases other than those that may need to be later released during fabrication.

Because the package itself is often the primary interface between a MEMS device and its control system, the package generally must be capable of transferring DC power and, in many designs, RF signals. Additionally, the package may often be required to distribute DC and/or RF power to other components inside the package. The drive to reduce costs and system form factor by increasing integration of MEMS and other components into substantially unitary packages often further complicates the electrical distribution problems as the number of interconnects within the package increases.

When certain designs require high frequency RF signals, the signals may often be introduced into the package along metal lines passing through the package walls, or may be electromagnetically coupled into the package through apertures in the package walls. In theory, RF energy may be coupled between the system and the MEMS without loss of power, but in actual practice, this is often not possible since perfect conductors, insulators, etc. are generally not available. Additionally, power may be lost to leakage of radiation, by reflection from components that are less than impedance matched or from discontinuities in transmission lines. The final connection between the MEMS and the DC and/or RF lines is usually made with wirebonds, although flip-chip die attachment and multilayer interconnects using thin dielectrics may also be employed.

For small signal circuits, the temperature of the device junction generally does not increase substantially during operation and thermal dissipation from the MEMS is typically not a problem. However, with the drive to increase integration of MEMS with power from other circuits, such as, for example, amplifiers—perhaps even within a single package—the temperature rise in device junctions may often be substantial and cause the circuits to operate out of design specifications. Accordingly, thermal dissipation requirements for power amplifiers, other large signal circuits and highly integrated packages may often place severe constraints on the package design.

The junction temperature $T_j$ of an isolated device is generally given by $T_j = RQ + T_{case}$, where: Q is the heat generated by the junction, which is generally dependent on the output power of the device and its efficiency; R is the thermal resistance between the junction and the case; and $T_{case}$ is the temperature of the case. The package engineer typically has little to no control over the junction heat Q and the case temperature $T_{case}$ and, therefore, must resort to optimization of the thermal resistance of the package R.

Accordingly, it may be shown that there are generally three principle thermal resistances to be considered: (1) the resistance through the package substrate; (2) the resistance through the die-attachment material; and (3) the resistance through the carrier or package base. Furthermore, the thermal, resistance of each is generally dependent on the thermal resistivity and the thickness of the specific material. A package base made of metal or metal composites usually has very low thermal resistance and therefore does not add substantially to the total resistance. When electrically insulating materials are used for bases, metal-filled via holes may be routinely used under the MEMS in order to provide a thermal gradient path, for example, to a heat sink. Although thermal resistance may be a consideration in the choice of the die attachment material, adhesion and bond strength may often be even more important. In order to minimize the thermal resistance through the die attachment material, the adhesive must generally comprise a surface that is both finished (e.g., lacks small-scale roughness), flat (e.g., lacks large-scale topographic differentials), thin and free of void volumes.

Specific MEMS applications often require custom package designs in order to optimize or otherwise meet the needs of a particular performance specification or metric. Conventional MEMS packages may be loosely grouped into the following general categories: metal; ceramic; plastic; and thin-film multilayer packages.

Metal packages are often used for microwave multi-chip modules and hybrid circuits since they generally provide good thermal dissipation and good EM shielding. Additionally, metal packages often may have a large internal volume while still maintaining mechanical reliability. Accordingly, metal packages may use an integrated base and sidewalls with a lid or may have a separate base, sidewalls and lid. Inside the package, ceramic substrates and/or chip carriers are generally employed for use with circuit feedthroughs.

The selection of a suitably adapted metal may also often be important. Cu-10/W-90, Silvar™ (a Ni/Fe alloy), Cu-15/Mo-85 and Cu-15/W-85 all have been shown to demonstrate good thermal conductivity and higher coefficients of thermal expansion (CTE) than silicon, which often make them good choices. Kovar™, a Fe/Ni/Co alloy, may also be employed. All of these materials, in addition to Alloy-46, may be used for the sidewalls and lid. Additionally, the packages may also be plated with Cu, Ag and/or Au.

Prior to final assembly, a device bake is usually performed to drive out any trapped gas or moisture in order to reduce the potential onset of corrosion-related failures. During conventional assembly, the highest temperature curing epoxies or solders are generally used first with subsequent processing temperatures decreasing until the final seal is completed at the lowest temperature in order to avoid later steps damaging earlier ones. Au/Sn is a commonly used solder that has proven to work well when the two materials to be bonded have similar CTE's. Au/Sn solder joints of materials with a large CTE differential are often susceptible to fatigue failures after temperature cycling to the extent that the Au/Sn inter-metallics that form tend to be brittle and therefore may not adequately accommodate subsequent fabrication stress.

Laser welding, to locally heat joints between two parts generally without raising the temperature of the entire part, may also be used as an alternative to solders. Irrespective of the sealing technique, typically no voids or misalignments may be tolerated since the resulting discontinuities may compromise package hermeticity. Hermeticity may also be affected by feed-throughs in the device packages. These feed-throughs are generally made of glass or ceramic. Glass often may crack during handling and/or thermal cycling. A conductor protruding through a ceramic feed-through often may not properly seal due to metallurgical properties. Generally, such failures are frequently attributable to processing problems as the ceramic generally must be metallized so that the conductor may be soldered or brazed to it. The metallization process must also generally allow for substantially complete wetting of the conducting pin to the ceramic inasmuch as incomplete wetting may cause failure during thermal cycle testing.

Ceramic packages have several features that make them especially useful for microelectronics as well as MEMS. In general, they provide small form factors and are easily mass produced at relatively low cost. Additionally, they may be made to demonstrate hermetic integrity and often may offer easier integration of signal distribution lines and feedthroughs. Ceramic packages also may be machined to perform a variety of functions. For example, by incorporating multiple layers of ceramics and interconnect lines, electrical performance of the package may be custom tailored to meet unique design specifications. Ceramic packages are often generally referred to as "co-fired multilayer ceramic packages". Multilayer ceramic packages also allow reduced cost of total system integration of multiple MEMS and/or other components. Such multilayer packages offer significant size and mass reduction over metal-walled packages.

Co-fired ceramic packages may be constructed from individual pieces of ceramic in the "green" or unfired state. These materials are generally thin, pliable films. During a typical process, the films are stretched across a frame. On each layer, metal lines may be deposited using thick-film processing (usually screen printing) with via holes for interlayer interconnects drilled or punched therein. After the layers have been configured, the unfired pieces are stacked and aligned, for example, using registration holes and lamination. Finally, the composite part may then be fired at a relatively high temperature. The MEMS components thereafter may be attached in place; usually organically (i.e., with epoxies) or metallurgically (e.g., with solders) followed by conventional wirebonding.

Several problems may affect the reliability of ceramic packages however. First, the green-state ceramic often shrinks during the firing step. The amount of volume reduction is generally dependent on the number and position of via holes and recesses cut into each layer. Accordingly, different layers may shrink more than others, thereby creating stress in the final package. Second, because ceramic-to-metal adhesion is generally not as strong as ceramic-to-ceramic adhesion, sufficient ceramic surface area must usually be available in order to assure a good bond between layers. This generally compromises the use of substantially continuous ground planes for power distribution and shielding. Instead, metal grids are often employed for these purposes. Third, processing temperature and ceramic properties often limit the choice of metal lines. To eliminate or otherwise reduce warping, the shrinkage rate of the metal and the ceramic must generally be matched. Additionally, the metal generally must not chemically react with the ceramic during the firing process. The metals most frequently used are W and Mo. There is, however, a class of Low Temperature Co-fired Ceramic (LTCC) packages. The conductors typically employed with LTCC's are Ag, AgPd, Au and AuPt. It is important to note, however, that Ag migration has been reported to occur at high temperatures, high humidity and along faults in LTCC's.

Two general thin-film multilayer packaging technologies are also used. One uses sheets of polyimide laminated together in a way similar to that used for LTCC packages, except a final firing is generally not required. Each individual sheet is typically about 25 μm thick and may be processed separately using thin-film metal processing. The second technique also uses polyimide, but each layer is spun onto and baked on the carrier or substrate die to form about 1 to about 20 μm thick layers. In this method, via holes are either wet etched or RIE'd into the substrate. The polyimide for both methods has a relative permittivity corresponding to about 2.8 to 3.2. Since the permittivity is low and the layers are thin, similar characteristic impedance lines may be fabricated with less line-to-line coupling. Accordingly, closer spacing of lines is often possible. In addition, the low permittivity results in relatively low line capacitance and correspondingly faster circuits.

Plastic packages have also been widely used by the electronics industry for many years and in almost every type of application due inter alia to their low manufacturing cost. In general, however, plastic packages are not hermetic and hermetic seals are generally required for most MEMS applications. Plastic packages are also generally susceptible to cracking in humid environments during temperature cycling of, for example, the surface mount assembly.

Conventional technologies for MEMS element attachment to device packages typically comprise methods generally borrowed from semiconductor IC device fabrication. One of the functions of die attachment is generally to provide good mechanical attachment of MEMS structures to the package base. This ensures inter alia that the MEMS carrier chip does not move relative to the package base. The attachment may also generally be required to provide good thermal connectivity between MEMS structures and the package base so that heat may be conducted away from the chip and spread over the package base which is generally larger in size and typically has more thermal mass. This spreading generally keeps the device operating within a desired temperature range.

The stability and reliability of attachment material is largely dictated by the ability of the material to withstand thermomechanical stresses created by, for example, the differences in the CTE between the MEMS silicon and the package base material. These stresses may be concentrated at the interface between the MEMS silicon backside and the attachment material as well as the interface between the die attachment material and the package base. Silicon has a CTE between about 2 and 3 ppm/° C. while most package bases have a higher CTE (i.e., about 6 to 20 ppm/° C.). The number of thermal cycles $N_f$ that a die attachment can generally withstand before failure is based on the Coffin-Manson relationship for strain given as $$N_f \propto \gamma^m \left( \frac{2t}{L(\Delta\alpha\Delta T)} \right),$$

where: γ represents the shear strain; m represents the material constant; L is the diagonal length of the die; Δα is the change in CTE and ΔT is the change in thickness of the die attachment material. See, for example, R. Darveaux and K. Banerji, "Fatigue Analysis of Flip Chip Assemblies Using Thermal Stress Simulations and Coffin-Manson Relation", Proc. 41st Elec. Comp. and Tech. Conf., 1991.

Voids in the die attachment material may cause areas of localized stress concentration that can lead to, for example, premature delamination. Various conventional MEMS packaging methods employ solders, adhesives and/or epoxies for die attachment. Each of these generally have advantages and disadvantages that affect overall MEMS reliability. Generally, when a solder is used, the silicon die may be configured with a gold backing. Au-80/Sn-20 solder generally may be used and forms an Au/Sn eutectic when the assembly is heated to approximately 250° C. in the presence of a forming gas. When this method is employed, a single rigid assembled part with low thermal and electrical resistances between the MEMS device and the package may be produced. One problem with this attachment method, however, is that solder may be rigid and brittle, which means that it may be even more important that the MEMS device and the package CTE's closely match since the solder generally cannot absorb the mechanical stresses.

Adhesives and epoxies are typically comprised of bonding materials filled with metal flakes. In general, Ag flakes may be used as the metal filler since Ag generally has good electrical conductivity and has been shown not to substantially migrate through die attachment materials. See, for example, H. L. Hvims, "Conductive Adhesives for SMT and Potential Applications", *IEEE Trans. On Components, Packaging and Manuf. Tech. Part-B*, 18, 2, 284–291, May 1995; and O. Rusanen and J. Lenkkeri, "Reliability Issues of Replacing Solder With Conductive Adhesives in Power Modules", *IEEE Trans. on Components, Packaging and Manuf. Tech. Part-B*, 18, 2, 320–325, May 1995. These die attachments materials generally have the advantage of lower process temperatures. Typically, between about 100 and about 200° C. are required to cure the composite. They also have a lower built-in stress from the assembly process as compared to solder attachment. Furthermore, since the die attachment does not create a substantially rigid assembly, shear stresses caused by thermal cycling and/or other mechanical forces may be relieved to some extent. See, for example, T. Tuhus and A. Bjomeklett, "Thermal Cycling Reliability of Die Bonding Adhesives", 1993 *IEEE Annual Inter. Reliability Physics Symp. Digest*, 208, Mar. 23–25, 1993; and P. Yalamanchili and A. Christou, "Finite Element Analysis of Millimeter Wave MMIC Packages Subjected to Temperature Cycling and Constant Acceleration", 1993 *GaAs REL Workshop Programs and Abstracts*, Oct. 10, 1993. One representative disadvantage of soft die attachment materials are that they have a significantly higher electrical resistivity which may be about 10 to 50 times greater than solder and a thermal resistivity on the order of 5 to 10 times greater than solder. Finally, humidity has been shown to generally increase the aging process of die attachment materials. See, for example, O. Rusanen and J. Lenkkeri, "Reliability Issues of Replacing Solder With Conductive Adhesives in Power Modules," *IEEE Trans. on Components, Packaging and Manuf. Tech. Part-B*, 18, 2, 320–325, May 1995.

Controlled Collapse Chip Connection (C4) is an interconnect technique developed by IBM during the 1960's as an alternative to manual wirebonding. Often termed "flip-chip," C4 forms a device die attachment with circuitry facing the substrate and solder bumps deposited through a bump mask onto wettable chip pads that generally connect to matching wettable substrate pads. Flip-chips typically are aligned to corresponding substrate metal patterns. Electrical and mechanical interconnects may be formed substantially simultaneously by reflowing of solder bumps. The C4 bonding process is generally self-aligning (i.e., the wetting action of the solder usually aligns the chip's bump pattern to the corresponding substrate pads). This action may be exploited to compensate for slight chip-to-substrate misalignment (up to several mils) occurring during chip placement.

One advantaged of C4 is the potential to rework. Several techniques exist that allow for removal and replacement of C4 chips without the need to discard the chip or substrate. In fact, rework may be performed numerous times without substantially degrading quality and/or reliability. For improved reliability, chip underfill may be inserted between the bonded chip and substrate; however, it should be noted that any rework must usually be performed prior to application of chip underfill.

Representative advantages of C4 include, for example: size and weight reduction; applicability for existing chip designs; increased I/O capability; performance enhancement; increased production capability; and rework/chip replacement. Relevant considerations may include, for example: additional wafer processing vs. wirebonding; supplemental design specifications; wafer probe complexity for array bump patterns; and unique thermal issues. Notably, C4 provides substantial performance, size and I/O density improvements. With C4, virtually the entire chip surface may be utilized for interconnect pad location. In fact, it has been demonstrated that over 2500 C4 bumps may be deposited on a chip and chips with over 1500 C4 bumps are currently in commercial production. C4 also generally enables increased interconnect density. Signal, clock and power connections may be placed almost anywhere on a chip and redundancy distributions may be optimized for minimized noise and skew, current density and line length. Moreover, on-chip wiring may be reduced since z axis vias may be made available where needed. Additionally, wirebond pitch is generally on the order of 76 $\mu$m (3 mil) pads on 100 $\mu$m (4 mil) centers; whereas C4 pitch, on the other hand, may be as much as 100 $\mu$m (4 mil) bumps on 230 $\mu$m (9 mil) centers. In this example, interconnect density is generally increased by a factor of over 140% with the implementation of flip-chip designs.

The reliability of flip-chip contacts is generally dependent on the difference in the CTE between the chip and the ceramic substrate or the organic printed circuit board (PCB). For example, the CTE for silicon is on the order of about 2–3 ppm/° K. For 96% alumina, the CTE is about 6.4 ppm/° K. and for PCB it is typically about 20 to 25 ppm/° K. The CTE differential between the chip and the carrier typically induces high thermal and mechanical stresses and strain at the contact bumps; the highest strain occurring generally at the corner joints, whose distance is the greatest magnitude from the distance neutral point (DNP) of the chip (e.g., the geometric center of the die). For example, the DNP for a 2.5 mm×2.5 mm chip is 1.7 mm. The thermomechanical stress and strain may cause the joints to crack. When the cracks become larger, the contact resistance increases and the flow of current is impeded—ultimately leading to device failure. A commonly accepted metric of reliability is defined as an increase in resistance in excess of about 30 m$\Omega$) over the 'zero time value'. See, for example, J. Kloeser et al., "Reliability Investigations of Fluxless Flip-Chip Interconnections on Green Tape Ceramic Substrates", *IEEE Trans. Components, Packaging and Manufacturing Technology— Part A*, 19, 1, 24–33, March 1996. One drawback in selecting an effective bump height, however, is that large bumps typically introduce a series inductance that may operate inter alia to degrade high-frequency performance and increase thermal resistance from the device to the carrier substrate.

Reliability of bump joints may be improved if, after reflow, a bead of encapsulating epoxy resin is dispensed near the chip die and drawn by capillary action into the space between the chip and the carrier. The epoxy may then be cured to provide the final flip-chip assembly. The epoxy-resin underfill generally mechanically couples the chip die and the carrier substrate and locally constrains the CTE differential, thus maximizing or otherwise improving the reliability of the joints. A generally important characteristic of the encapsulating structure is that it have a good CTE match with the z expansion of the solder and/or bump material. For example, if Pb-95/Sn-5 solder having a CTE of 28 ppm/° K. is used, an encapsulant with a CTE on the same order of magnitude is typically recommended. Underfilling also generally permits packaging of larger device chips by increasing the allowable DNP. In some cases, the encapsulant may act as a protective layer on an active surface of the chip. Good adhesion among the underfill material, the carrier substrate and the chip die surface is usually required for suitably adapted stress compensation. The adhesion between surfaces may be lost and delamination can occur if contaminants, such as post-reflow flux residue, are present. For this reason, a fluxless process for flip-chip assembly is usually desirable. Unfortunately, flip-chip bonding on PCB generally requires the use of flux. See, for example, J. Giesler et al., "Flip-chip on Board Connection Technology: Process Characterization and Reliability", *IEEE Trans. Components, Packaging and Manufacturing Technology—Part* 8, 17, 3, 256–263, August 1994. However, on ceramic carriers with Au, Ag and Pd/Ag thick-film patterns and via metallizations, fluxless flip-chip thermocompression bonding with Au/Sn bumps has demonstrated reasonably high reliability.

Additionally, care should be taken that the encapsulant or underfill covers substantially the entire underside without air pockets and/or void volumes in order to form substantially complete edge fillets around substantially all sides of the chip. Voids generally create high-stress concentrations and may lead to early delamination of the encapsulating structure. After assembly, a scanning acoustic microscope, for example, may be used to image voids in the encapsulant. The encapsulant should also typically be checked for microfissures and/or surface flaws, which have a tendency to propagate with thermal cycling and environmental attacks, potentially leading to device failure. See, for example, D. Suryanarayana et al., "Encapsulant used in Flip-Chip Packages," *IEEE Trans. Components, Packaging and Manufacturing Technology*, 16, 8, 858–862, December 1993.

Ball Grid Array (BGA) is another technique involving a surface mount chip package that employs a grid of solder balls as connectors and is noted for its compact size, high lead count and low inductance, which generally allows lower voltages to be used. BGA's typically come in plastic and ceramic varieties and have generally evolved from C4 technology. However, more I/O's may often be utilized in the same area as, for example, in a peripherally leaded package or chip. The CBGA and PBGA techniques are not generally regarded as chip scale packaging techniques; however, the evolution of PBGA has developed from the experience generally obtained from the CBGA and PBGA packaging techniques.

Originally designed by IBM, Ceramic Ball-Grid-Array (CBGA) was developed as a compliment to the C4 flip-chip technology. CBGA packages are generally comprised of a ceramic substrate, a C4 chip and an aluminum lid. The ball-grid spacing is typically on 50 mil centers with solder balls composed of high melt solder (Pb-90/Sn-10) attached by eutectic solder (Sn-63/Pb-37). Recent designs have generally focused on miniaturization and have reduced package size form factors by employing 40 mil on center solder balls.

Aluminum covers that have typically been used with C4 technology have been bonded with silicone adhesive (i.e., Sylgard 577) to provide inter alia a non-hermetic seal. With flip-chip technology, this is generally adequate for most applications. A hermetic seal may be achieved by designing a seal ring into the ceramic and using, for example, a Ni/Fe cover plate for soldering. The package generally has a recess to allow conventional chip-and-wire technology to be employed. A MEMS device may be utilized in a wirebond package configuration first and thereafter migrated for use as a flip-chip in later designs.

Plastic Ball-Grid-Array (PBGA) packaging is very similar to plastic packaging technology. It is based on substantially the same chip-and-wire technology and has moisture sensitivity (i.e., susceptibility to "popcorn" cracking during solder reflow) similar to plastic packaging. PBGA is different, however, in that it is generally built on a printed circuit board substrate rather than a leadframe (e.g., metal) material. The attachment method, for example, may be accomplished by soldering solder balls or bumps rather than leads. One advantage PBGA technology has over other plastic packaging is that the PC board material (i.e., FR4, polyimide, BT resin, etc.) may be a simple two layer board or be made of a plurality of layers. Additional layers may also allow for power and/or ground planes.

Micro-Ball-Grid-Array ($\mu$BGA) is generally regarded as a true "Chip Scale Package" (CSP) solution with typical dimensions only slightly larger than the die itself (i.e., die+about 0.5 mm). $\mu$BGA is generally employed as an ideal package type for a variety of memory devices such as, for example, Flash, DRAM and SRAM. $\mu$BGA packages typically enable broad surface area reductions of about 50%–80% over existing alternative packages. End use applications include mobile phones, sub-notebooks, PDA's, camcorders, disk drives and other devices well-known in the art. The $\mu$BGA package is also a solution for applications requiring smaller, thinner, lighter or electrically enhanced packages. The $\mu$BGA package is generally constructed utilizing a thin, flexible circuit tape for the substrate and a low stress elastomer for die attachment. The die is usually mounted face down with its electrical pads connected to the substrate in a method similar to TAB bonding. After bonding leads to the die, the leads may be encapsulated with an epoxy material for protection. Solder balls are thereafter attached to pads on the bottom of the substrate, for example, in a rectangular matrix similar to other BGA packages. The backside of the die is usually exposed to permit heat sinking if required for thermal dissipation. Ball pitches available to date are on the order of 0.50, 0.75, 0.80, and 1.0 mm. Other features and benefits include, for example: 0.9 mm mounted height; excellent electrical and moisture performance; Sn-63/Pb-37 solder balls; and access to a variety of generally well-developed commercial design services.

Multi-chip packaging of MEMS may also be a viable means of integrating MEMS with other microelectronic technologies such as, for example, CMOS. One of the advantages of using multi-chip as a packaging mechanism for MEMS and microelectronics is the ability to inter alia efficiently host dies from different and/or otherwise incompatible fabrication processes into a unitary substrate. High performance Multi-Chip Module (MCM) technology has progressed rapidly in the past decade, making MCM attractive for use with MEMS. For example, the Chip-on-Flex (COF) process has been adapted for the packaging of MEMS. See, J. Butler et al., "Advanced multi-chip module packaging of microelectromechanical systems", *Tech Digest of the 9th International Conference on Solid-State Sensors and Actuators (Transducers '97)*, 1, June 1997. One of the goals of this work has been to reduce the potential for heat damage to MEMS devices during, for example, laser ablation. Additional processing has also been adapted to inter alia minimize the impact of residue left on the device die. See, for example, J. Butler et al., "Extension of High Density Interconnect Multi-chip Module Technology for MEMS Packaging", *SPIE*, 3224, 169–177.

COF is an extension of HDI technology developed in the late 1980's. The standard HDI "chips first" process consists of embedding substantially bare dies in cavity recesses milled into, for example, a ceramic substrate and then fabricating a layered thin-film interconnect structure over the components. Each layer in the HDI interconnect overlay may be constructed by bonding an insulating film on the substrate and forming via holes with, for example, laser ablation. Thereafter, metallization may be accomplished with sputtering and photolithography. See, for example, W. Daum et al., "Overlay high-density interconnect: A chips-first multi-chip module technology", *IEEE Computer*, 26, 4, 23–29, April 1993.

COF processing generally retains the interconnect overlay typically used in HDI, however molded plastic is usually employed in place of a ceramic substrate. Unlike HDI, the interconnect overlays are typically prefabricated before chip attachment. After the chips have been bonded to the overlay, a substrate may be formed around the components using, for example, a plastic mold forming process such as transfer, compression or injection molding. Vias may then be laser drilled to the component bond pads and metallization may then be sputtered and patterned to form low impedance interconnects. See, for example, R. Filtion et al., "Demonstration of a chip scale chip-on-flex technology", *Proceedings of the 1996 International Conference on Multi-chip Modules—SPIE*, 2794, 351–356, April 1996. For MEMS packaging, COF processes are usually augmented by the addition of a processing step for laser ablating relatively large windows in the interconnect overlay in order to permit physical access to the MEMS structures. Additional plasma etching may also be included after via and large area laser ablations in order to minimize adhesive and polyimide residue which generally accumulates in the exposed windows.

Additionally, MEMS test die may be used to compare the impact of various packaging technologies as they relate to MEMS devices. Test die typically contain structures designed to facilitate methods of monitoring the integrity and/or performance of MEMS devices after packaging. Surface micromachined test dies have been available through Multi-User MEMS Processes (MUMP's). The MUMP's process typically has three structural layers of polysilicon separated by sacrificial layers of silicon oxide. The MUMP's substrate may also be electrically isolated from the polysilicon layers by, for example, a silicon nitride barrier. The uppermost layer of the composite is usually Au and is generally provided to facilitate low-impedance wiring of MEMS devices, but may also be used as a reflective surface for various optical devices. Representative test structures typically found on test dies are breakage detectors (i.e., to monitor excessive force) and polysilicon resistors (i.e., to monitor excessive heating).

In one investigation, a bulk micromachining test die was fabricated through MOSIS using an Orbit CMOS MEMS process. The CMOS MEMS process is typically based on a standard 2 $\mu$m CMOS technology and generally has two metal and two polysilicon layers. Additional processing may generally be added to permit MEMS fabrication. Provisions are usually made to specify cuts in an overglass in order to expose a silicon substrate for bulk micromachining. Additionally, regions of B doping may be specified to form etch steps for anisotropic Si etchants such as ethylene diamine pyrocatechol (EDP) and potassium hydroxide (KOH). These tools generally allow for bulk micromachining to be accomplished in standard CMOS processes. See, for example, J. Marshall et al., "High-level CAD melds micromachined devices with foundries", *Circuits and Devices*, 9, 6, 10–17, November 1992. A sampling of integrated circuits, such as, for example, ring oscillators for testing package interconnects may also be optionally included on a test die.

System on a chip (SOAC) is generally derived from wafer fabrication processes wherein various individual functions may be processed on substantially a single piece of silicon. These processes, generally comprising CMOS technologies, are typically compatible with MEMS processing techniques. Most SOAC chips are designed with a microprocessor of some type, memory and signal processing functions. It is believed that MEMS devices may one day be incorporated on a SOAC; initially, for example, by incorporation of some other packaging technology such as flip-chip or $\mu$BGA.

Most MEMS designs either have spatially active components or do not otherwise permit close physical contact of an encapsulating material, such as in conventional plastic packages. Studies have demonstrated that during a high-temperature soldering process, for example, encountered while mounting packaged semiconductor devices on circuit boards, moisture present in a plastic package may vaporize and exert stress on the package. This stress may cause the package to crack and also to delaminate between the mold compound and the lead frame or device die. This phenomenon has often been referred to as "popcorn" cracking. These effects are generally most pronounced if the package has greater than about 0.23% absorbed moisture before solder reflow. See, for example, T. M. Moore and S. J. Kelsall, "The Impact of Delamination on Stress-Induced and Contamination-Related Failure in Surface Mount IC's", *1992 IEEE Annual Int. Reliability Physics Symp. Proc.*, 169–176, Mar. 31–Apr. 2, 1992. The differential in CTE's of the package components also may induce stress. If the combined stresses are greater than the fracture strength of the plastic, cracks will develop. The cracks may thereafter provide a path for contaminants to reach the die surface and/or die delamination may cause wirebond failure.

JEDEC defines five classes for moisture resistance of plastic packages and sensitivity to popcorning. Class 1 is generally defined as unlimited exposure to moisture where the package will not exhibit delamination during surface mount operations. Class 5 may tolerate minimal exposure to moisture before needing to be dried (i.e., via baking in an oven set at about 125° C. for a duration of 8–24 hours, depending on the package). Classes 2 through 4 are generally defined as somewhere in the continuum between these extremes. Most commercial packages may be classified as Class 3 moisture resistant. To address the delamination problem, results derived from numerical simulation and experimental data may serve as a guide in the selection of suitable molding compound properties. See, for example, A. A. O. Tay et al., "Predicting Delamination in Plastic IC Packages and Determining Suitable Mold Compound Properties", *IEEE Trans. Components, Packaging and Manufacturing Technology—Part* 8, 17, 2, 201–208, May 1994. The properties most often generally considered are, for example, the adhesion strength and the CTE's. The amount of moisture a particular package design may take up prior to delamination and popcorning may also be empirically determined. Also, it has been shown that polyimide die overcoat (PIX) may reduce the number of die or pad delaminations by up to about 30% on parts subjected to temperature cycling. See, for example, W. J. Roesch and A. L. Rubalcava, "GaAs IC Reliability in Plastic Packages", 1995 *GaAs Reliability Workshop Programs and Abstracts*, 25–30, Oct. 29, 1995. PIX coatings may also provide for mechanically supporting air bridges during plastic encapsulation, more uniform electrical environments for the die as well as protection of the surface of the die.

Another mechanisms by which a chip may experience failure in a plastic package may be caused by, for example, bondwire sweep and lift-off; which in turn may be caused, for example, by viscous flow of molten plastic material. The viscosity of molten plastic is generally a function of filler particle size and concentration. Studies suggest that given three wirebonds, the one corresponding to a raised die typically experiences the largest maximum displacement. See, for example, A. A. O. Tay et al., "The Effect of Wirebond Geometry and Die Setting on Wire Sweep", *IEEE Trans. Components, Packaging and Manufacturing Technology—Part B*, 18, 1, 201–209, February 1995. Furthermore, the raised die and the downset die typically experience maximum stress at the ball bonds. Accordingly, in these cases, plastic deformation of the ball bonds may be a principle cause of failure. In contrast, the wirebond for double-downset dies generally suffer only elastic deformation; thus, a double-downset configuration is generally regarded as a recommended device layout for the minimization of bondwire sweep.

After release of spatially active elements, MEMS devices may be probed to test their functionality. Unfortunately, probed "good" conventionally packaged MEMS may often be lost in significant quantity due to damage occurring during subsequent packaging steps. For example, they may be damaged because they are unprotected (e.g., "released"). Subsequent processing steps may include, for example: sawing or cutting (e.g., dicing corresponding to device singulation) of the wafer; attaching devices to their packages (e.g., die attachment) with various methods, such as, for example, wirebonding or other interconnection methods (i.e., flip-chip solder bumping, direct metallization, interconnecting, etc.); pre-seal inspection; sealing; windowing; package sealing; plating; trimming; marking; testing; shipping; storage; installation and such other MEMS fabrication processing steps now known or hereafter derived or otherwise described in the art. Potential risks to vulnerable MEMS elements include, for example: electrostatic effects; dust, moisture; contamination; handling stresses and thermal effects. For example, ultrasonic bonding of wirebond joints may cause undesirable damaging vibrations of released MEMS elements. Likewise, application of adhesive coatings (i.e., for die attachment) to the backside of the wafer may similarly damage released MEMS elements by unintentional contamination and/or adsorption of harmful materials.

One conventional solution to such representative packaging problems has been to keep the original sacrificial glass coatings intact for as long as possible. In one prior art approach, MEMS elements are released after substantially all of the high-risk packaging steps have been completed—including sawing of the wafer into chips. Another approach has been to release the MEMS elements at the wafer scale, apply performance-enhancing coatings, re-apply a temporary replacement protective coating prior to wafer sawing, and removal of the protective coating after substantially all of the high-risk packaging steps have been completed.

In order to reduce the costs of MEMS fabrication and packaging, it is generally desirable to perform as many fabrication steps at the wafer scale (e.g., before device singulation). As previously mentioned, one example of a conventional, although deficient, wafer scale process is deposition of performance-enhancing coatings on released MEMS elements (e.g., anti-striction films and adhesion-inhibitors). Unfortunately, if such coatings are applied at the wafer scale after release of MEMS elements, then some of the performance-enhancing coatings may often be unintentionally deposited on, for example, the backside of the wafer. These unwanted coatings may interfere with subsequent die attachment. Moreover, subsequent removal of unwanted backside coatings may damage or otherwise contaminate the released MEMS elements.

Skilled artisans will therefore appreciate as readily apparent that none of the approaches discussed vide supra provides a substantially integrated solution for low-cost, high-yield, high-capacity, commercial array packaging of microsensor, MEMS and/or IMEMS devices.

Wafer Level/Array MEMS Packaging

In one representative aspect, a device suitably adapted for wafer scale packaging of MEMS dies, in accordance with various exemplary embodiments of the present invention, is disclosed as generally comprising: a dielectric lid, a hermetic seal; a package housing comprising thermal characteristics closely matched with those of RF MEMS devices for containment therein; and device recesses, within which MEMS structures may freely move. In another exemplary embodiment, the present invention provides a system and method for wafer level packaging of, for example, multiple MEMS devices while achieving hermetic seals and EM shielding of the fabricated device packages at substantially lower cost than that of discrete packaging techniques. For example, a dielectric EM shielding lid may be produced by designing a mask having, for example, multiple cells; each cell being at least slightly larger than the normal surface area presented by a MEMS device to be covered therewith and each cell substantially outlined by a frame to provide means for annularly engaging enclosure of at least one MEMS device die element with at least one dielectric lid element at the peripheral boundaries of the MEMS device die elements and the dielectric lid elements. Thereafter, the mask may be used in the fabrication of a processed substrate to produce, for example, a dielectric lid array suitably adapted for wafer level MEMS packaging.

Figure 15:
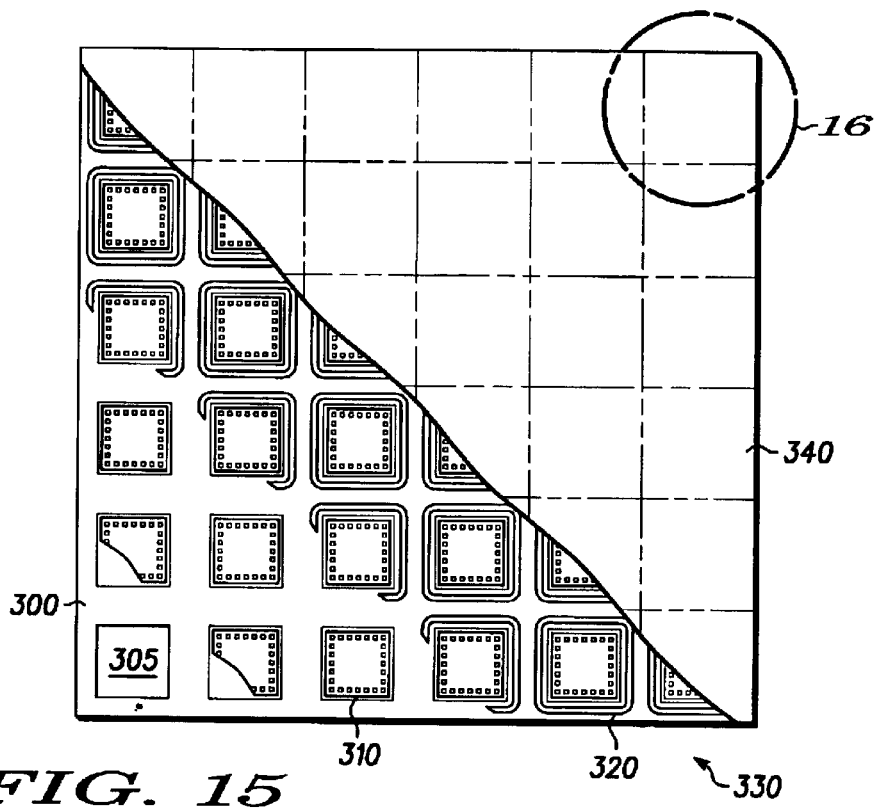
FIG. 15 illustrates a representative array package in accordance with an exemplary embodiment of the present invention.
Figure 16:
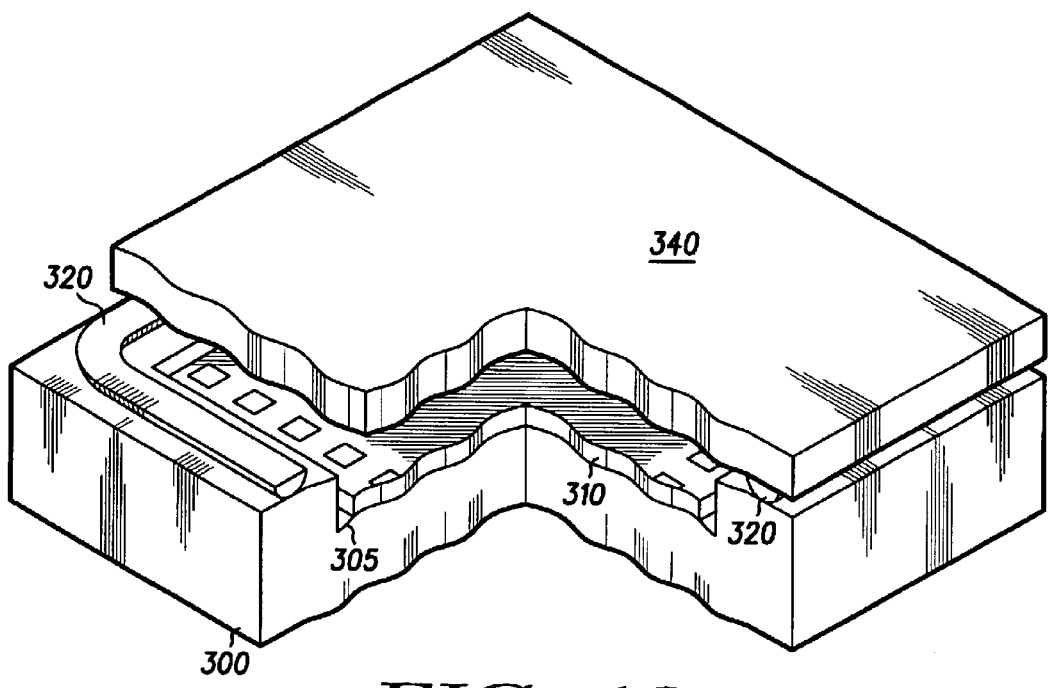
FIG. 16 illustrates a representative discrete device package singulated, for example, from the array package of FIG. 15 in accordance with an exemplary embodiment of the present invention.

FIG. 16 representatively illustrates one such lid substrate element for clarity; however, skilled artisans will appreciate that an array of multiple lid elements 340 may be embodied in a substantially unitary lid array to provide inter alia a lid array for subsequent wafer level and/or array packaging as generally and representatively depicted, for example, in FIG. 15.

In one exemplary embodiment of the present invention, incoming substrate 100, as shown for example in FIG. 1, may comprise a substantially insulating base 102 (i.e., any of silicon, quartz, glass, GaAs, sapphire, ceramic and/or the like) and/or conductive features 101 (i.e., any of Al, Au, Cr, Cu, Pb, Sn, Ti, W, any metal and/or any metal alloy and/or the like) and/or passivation features 104 (i.e., any of silicon dioxide, silicon nitride, alumina, polyimide, BCB, polymers and/or the like). In one representative aspect, in accordance with another exemplary embodiment of the present invention (not depicted), substrate 100 may be configured to comprise at least one insulating layer covering an outermost surface of substrate 100 wherein the outermost insulating layer is presented for further processing of the substrate to produce a dielectric EM shielding lid. In yet another exemplary embodiment (not depicted), substrate 100 may alternatively comprise a substantially flat sheet of glass, quartz, ceramic or silicon.

Figure 2:
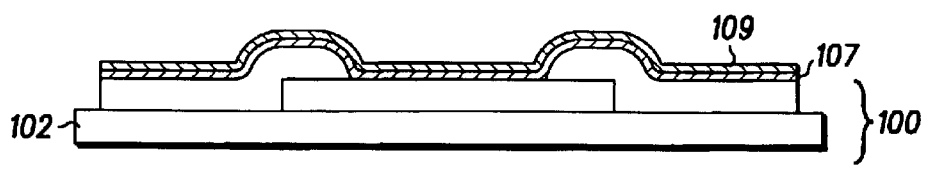
FIG. 2 illustrates a representative intermediate corresponding to processing of the substrate depicted, for example, in FIG. 1 in accordance with an exemplary embodiment of the present invention.
Figure 9:
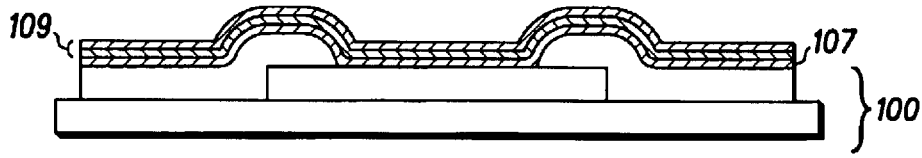
FIG. 9 illustrates a representative intermediate corresponding to processing of the substrate depicted, for example, in FIG. 1 in accordance with another exemplary embodiment of the present invention.

Substrate 100 may be presented for deposition of layers of metal films comprising, for example: TiW/Cu; Cr/Cu; Al, Au, Cr, Cu, Pb, Sn, Ti, W, any metal and/or any metal alloy, as shown for example in FIG. 2. In a specific and representative embodiment, metal layer 107, comprising for example TiW, may be deposited on substrate 100, wherein the TiW layer may be provided for, or otherwise suitably adapted to provide, adhesion of a Cu film to substrate 100. In another exemplary embodiment, TiW and/or Cr may be later used as a dewetting layer to prevent inter alia solder from wetting onto unwanted areas of the lid. Metal layer 107 may be deposited with evaporation, electrodeposition or sputtering and/or any other method of metal deposition now known or hereafter derived or otherwise described in the art. Metal/dewetting layer 107 may be configured to be relatively thin (i.e., about 0.2 $\mu$m). Alternatively, if a thicker metal film may be needed for particular MEMS package specifications (i.e., to improve RF shielding), then a relatively thick metal film (i.e., Al) may be deposited onto substrate 100 prior to deposition of metal/dewetting layer 107. Additionally, at least one additional layer 109 may be optionally deposited over metal/dewetting layer 107 to provide etching targets for the development of additional features in the processing of substrate 100. FIG. 9 representatively depicts an alternative exemplary embodiment wherein a plurality of additional layers 109 are deposited over metal/dewetting layer 107 prior to further lithographic processing of the substrate.

Figure 3:
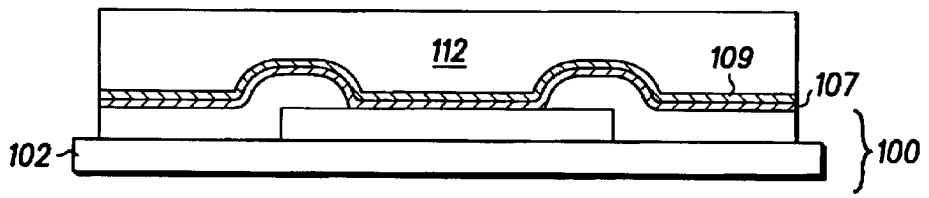
FIG. 3 illustrates a representative intermediate corresponding to further processing of the intermediate depicted, for example, in FIG. 2 in accordance with an exemplary embodiment of the present invention.
Figure 4:
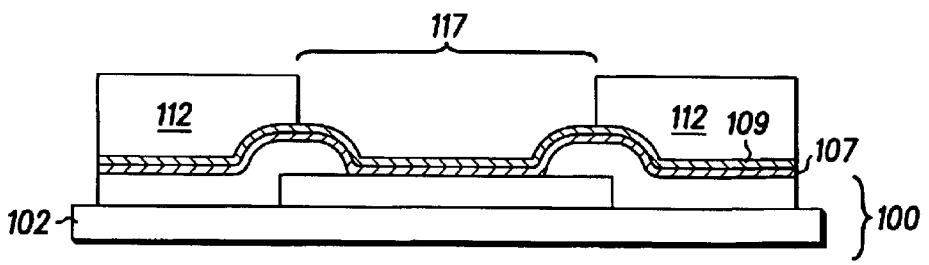
FIG. 4 illustrates a representative intermediate corresponding to further processing of the intermediate depicted, for example, in FIG. 3 in accordance with an exemplary embodiment of the present invention.
Figure 5:
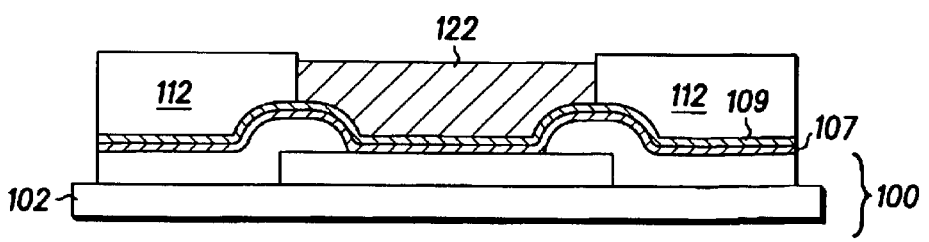
FIG. 5 illustrates a representative intermediate corresponding to further processing of the intermediate depicted, for example, in FIG. 4 in accordance with an exemplary embodiment of the present invention.

Thereafter, any photolithographic process, whether now known or hereafter described in the art, may be employed for further processing of the lid substrate. For example, photoresist 112 may be coated substantially over metal/dewetting layer 107, as shown for example in FIG. 3. Photoresist 112 may then be patterned and developed to define a window frame 117, as shown, for example, in FIG. 4. Window frame 117 may then be plugged with metal 122 (i.e., Cu) by electrodeposition, as representatively shown in FIG. 5. Skilled artisans will appreciate that any method of metal deposition now known or hereafter described in the art may be used to deposit metal 122 into window frame 117, including, but not limited to, any of: sputtering; CVD; PVD; MBE; combustion torch; electric arc; plasma spray; ion plating; ion implantation; laser surface alloying and such other deposition techniques now known or hereafter described in the art. For an introduction to various deposition techniques that may be used in accordance with various exemplary embodiments and aspects of the present invention, see, for example, Krishna Seshin, "Handbook of Thin Film Deposition Techniques: Principles, Methods, Equipment and Applications", Second Edition, 2001.

Figure 6:
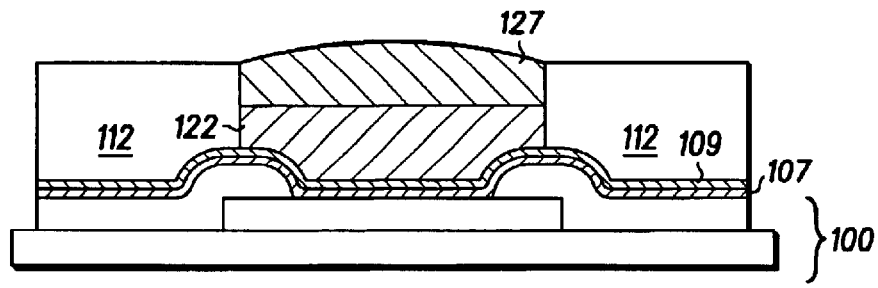
FIG. 6 illustrates a representative intermediate corresponding to further processing of the intermediate depicted, for example, in FIG. 5 in accordance with an exemplary embodiment of the present invention.

In one representative and exemplary embodiment, metal 122 comprises Cu deposited to a desired thickness inter alia to substantially prevent solder dewetting (i.e., providing enough Cu 122 for solder 127/Cu 122 reaction to proceed; thereby preventing dewetting of solder from underlying metal/dewetting layer 107), as shown, for example, in FIG. 6. In another exemplary embodiment, metal 122 comprises Cu deposited to a thickness of about 6 to 15 $\mu$m or Ni deposited to about 6 $\mu$m.

Thereafter, solder 127 may be deposited to a desired thickness using any means of metal deposition now known or hereafter described in the art. In one representative embodiment, solder 127 may be deposited by electrodeposition, as shown, for example, in FIG. 6. The composition of solder 127 may be optimized or otherwise modified for various MEMS chip specifications and/or subsequent fabrication process parameters (i.e., temperature, humidity, pressure, etc.). For example, a relatively high melting point solder, such as, for example, Sn/0.7Cu (m.p.=227° C.) and/or substantially pure Sn (m.p.=232° C.), may be used if the package is to be subsequently subjected to, for example, eutectic Sn/Pb (m.p.=183° C.) soldering processes. Various other solder compositions and or solder alloy systems well-known or otherwise described in the art may be employed or otherwise suitably optimized or variously adapted for particular specifications and/or process parameters.

Figure 7:
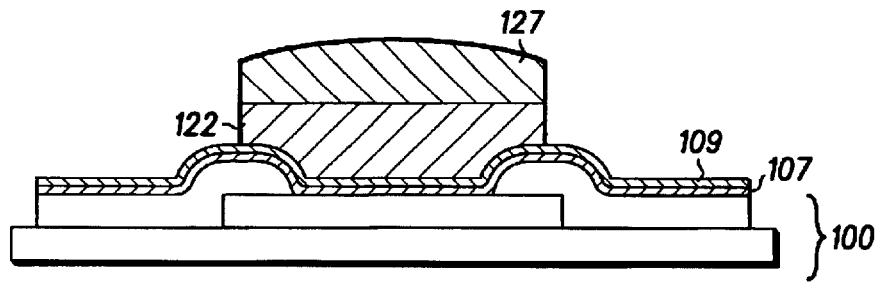
FIG. 7 illustrates a representative intermediate corresponding to further processing of the intermediate depicted, for example, in FIG. 6 in accordance with an exemplary embodiment of the present invention.
Figure 8:
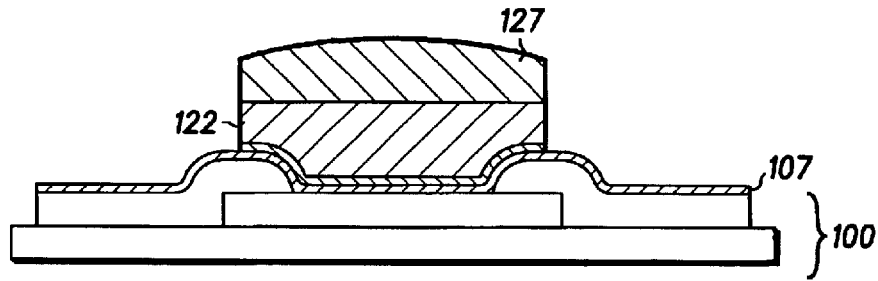
FIG. 8 illustrates a representative device corresponding to further processing of the intermediate depicted, for example, in FIG. 7 in accordance with an exemplary embodiment of the present invention.
Figure 10:
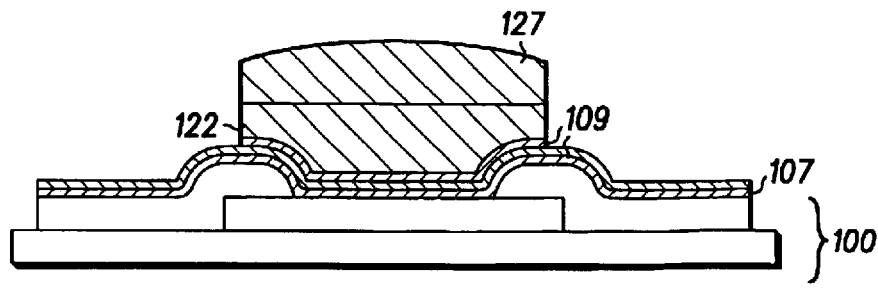
FIG. 10 illustrates a representative device corresponding to further processing of the intermediate depicted, for example, in FIG. 9 in accordance with an exemplary embodiment of the present invention.

Thereafter, the remaining photoresist 112 may be stripped, as shown, for example, in FIG. 7, to substantially expose metal layer(s) 109 for subsequent etching, as shown, for example, in FIG. 8. In one exemplary embodiment, metal layer(s) 109 may comprise at least one of Ag, Al, Au, Cr, Cu, Hf, Mo, Nb, Ni, Pb, Pd, Sn, Ta, Ti, V, W, Zr, any metal and/or a metal alloy. In one specific and representative embodiment, metal layer 109 comprises Cu and metal/dewetting layer 107 comprises a TiW film for substantially providing EM shielding. In the case of the optional deposition of multiple metal layers 109 over incoming substrate 100 and metal/dewetting layer 107, a lid element substantially conforming to the representatively illustrated device depicted, for example, in FIG. 10 may be obtained.

Figure 11:
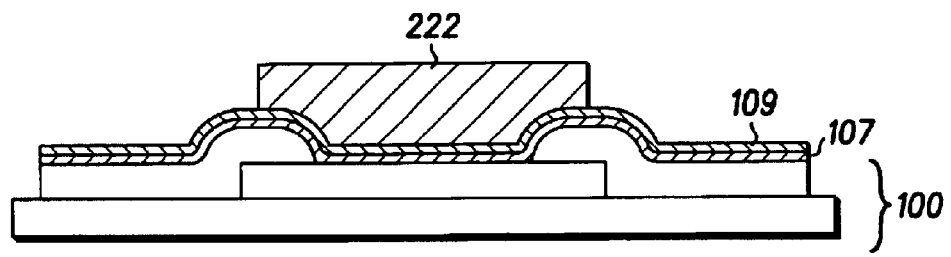
FIG. 11 illustrates a representative intermediate corresponding to alternative processing of the intermediate depicted, for example, in FIG. 5 in accordance with an alternative exemplary embodiment of the present invention.
Figure 12:
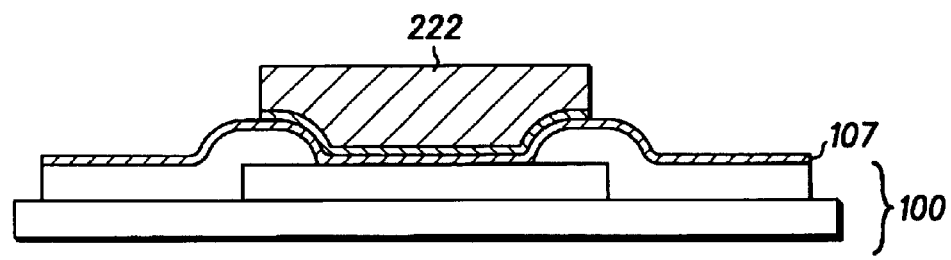
FIG. 12 illustrates a representative intermediate corresponding to further processing of the intermediate depicted, for example, in FIG. 11 in accordance with an exemplary embodiment of the present invention.
Figure 13:
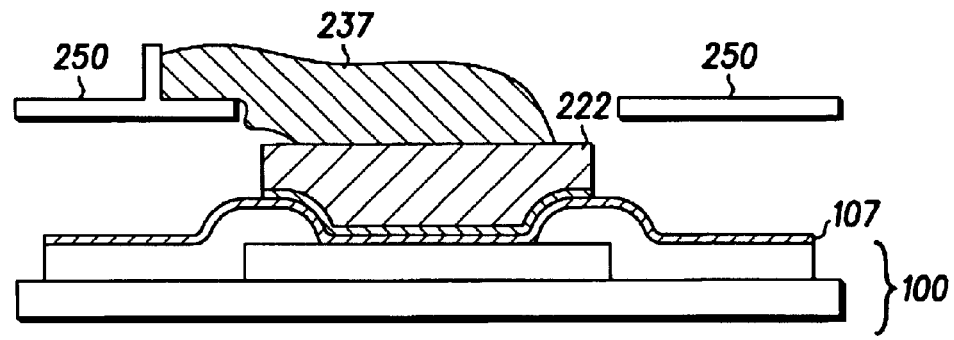
FIG. 13 illustrates a representative device corresponding to further processing of the intermediate depicted, for example, in FIG. 12 in accordance with an exemplary embodiment of the present invention.
Figure 14:
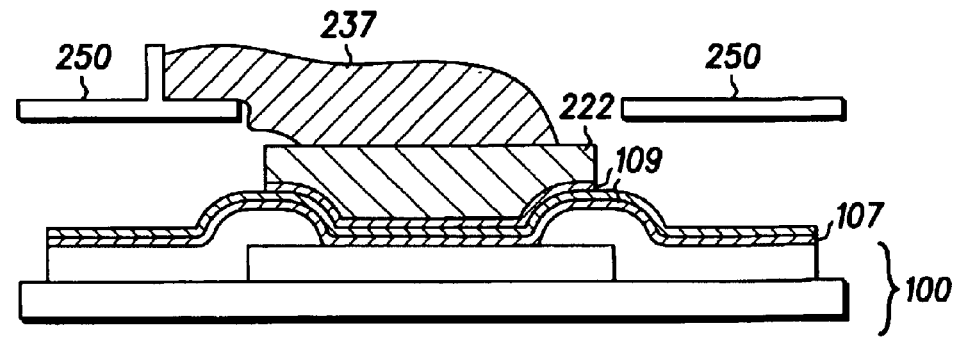
FIG. 14 illustrates a representative device corresponding to further processing of the intermediate depicted, for example, in FIG. 9 in accordance with an exemplary embodiment of the present invention.

Alternatively, photoresist 212 may be stripped, as shown for example in FIG. 11, and metal 207 etched substantially prior to solder plating, as shown, for example, in FIG. 12, in order to expose metal window frame 222; thereafter, solder 237 may be applied by any of: stencil printing/reflow 235 (i.e., using stencil mask 250), as shown, for example, in FIG. 13; perform; and/or solder dipping or any method of solder deposition now known or hereafter developed or otherwise described in the art. In the case of the optional deposition of multiple metal layers 109 over incoming substrate 100 and metal/dewetting layer 107, a lid element substantially conforming to the representatively illustrated stencil print/reflow apparatus depicted, for example, in FIG. 14 may be alternatively obtained.

In one exemplary embodiment, the finished lid array comprises a plurality of lid elements 340, as shown, for example, in FIG. 15, having recesses 305 for receiving MEMS devices 310 therein and peripherally bounded by, for example, solder sealing rings 320. Finished lid array may then be aligned with MEMS device array 300 with, for example, solder reflow to seal said lid array to said device array 300 to produce a substantially sealed package array 330. In an exemplary embodiment of the present invention, said package array 330 may be optionally heat treated inter alia to tune reflow of solder, for example, to improve integrity, thermal conductivity, electrical conductivity, etc. of the seal and/or the like. In the case where solder sealing of a dielectric lid array element to a MEMS device die element 340 is substantially complete, the seal may be said to demonstrate hermetic integrity. In various other embodiments, seal ring 320 may be any of, for example: a solder; a metal; a metal alloy; an adhesive and/or any combination thereof or such other sealing means now known or hereafter derived or otherwise described in the art. In another exemplary embodiment of the present invention, said package array 330 may be optionally subjected to device testing and/or other fabrication quality control processes, for example, substantially prior to subsequent device singulation. Thereafter, package array 330 may be diced into substantially individual MEMS devices, as shown for example in FIG. 16.

In a representative and exemplary embodiment of the present invention, solder ring 320 and/or the RF shielding region of the dielectric lid 340 may be attached to ground, wherein said ground may further comprise a device common ground through, for example, at least one interconnection on the device side of said. MEMS package. Skilled artisans will appreciate, however, that various other grounding geometries and/or configurations, whether now known or hereafter described in the art, may be alternatively, conjunctively or sequentially used in various other embodiments in accordance with the present invention. For example, a Cu stud encased in metal solder may be grounded through a device common ground that may optionally include a ground plane in, for example, a redistribution layer or some other grounding feature within, for example, a multilayer ceramic structure.

Additionally, the present invention may be suitably adapted for the production of RF shielded RF MEMS devices or, alternatively, may be applied to any other process now known or hereafter developed or otherwise described in the art as involving at least partially selective soldering of metallized surfaces. In one exemplary and representative embodiment, seal ring 320 may comprise an electroplated Sn/Cu seal ring formed on a lid array 340 comprising, for example, a TiW metallized glass slide. Additionally, device array 300 may comprise a solder wettable layer (i.e., Au) for providing solderable sites inter alia to seal array of lid elements 340 to MEMS device array 300.

Accordingly, devices comprising EM shielding dielectric lids and corresponding wafer level packaging methods have been described for low cost packaging of MEMS devices that generally requires no further wirebonding processing or fabrication steps. The disclosed methods and/or devices are understood to be applicable to any type of MEMS device (i.e., mechanical, optical, etc.) and/or to any type of microsensors (i.e., for harsh environments and/or biomedical applications, etc.). In certain representative and exemplary implementations, sealed RF MEMS device packages, in accordance with various exemplary embodiments of the present invention, may be particularly well suited for 3G and/or local LAN applications.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims. As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

What is claimed is:

1. A device packaging element comprising:
   a dielectric lid:
   said dielectric lid comprising at least one of: an insulating layer and a conductive layer;
   said dielectric lid suitably adapted for effectively enclosing a MEMS device on a device substrate, wherein engagement or said dielectric lid with said device substrate defines a MEMS device enclosure; and
   said dielectric lid suitably adapted to effectively shield said MEMS device from at least one of electromagnetic (EM) energy incident to said device enclosure and leakage of EM energy from said device enclosure.

2. The device packaging element of claim 1, wherein:
   said insulating layer comprises at least one of GaAs, silicon, quartz, glass, sapphire and ceramic; and
   said conductive layer comprises at least one of Ag, Al, Au, Cr, Cu, Hf, Mo, Nb, Ni, Pb, Pd, Sn, Ta, Ti, V, W, Zr, a metal and a metal alloy.

3. The device packaging element of claim 1, wherein;
   said EM energy comprises radio frequency (RF) energy; and
   said dielectric lid further comprises a seal suitably adapted for effectively sealing said dielectric lid to said device substrate.

4. The device packaging element of claim 3, wherein:
   said seal comprises a conductive seal; and
   at least one of said conductive seal and said conductive layer are connected to ground.

5. The device packaging element of claim 4, wherein:
   said connection to ground comprises a device common ground connection through an interconnect of said device substrate; and
   wherein said MEMS device comprises an RF MEMS switch.

6. An EM shielded MEMS device package, comprising:
   a device die comprising a MEMS device;
   a dielectric lid, wherein said dielectric lid comprises a metal layer;
   said dielectric lid suitably adapted for effectively enclosing said MEMS device on said device die; and
   said dielectric lid suitably adapted to effectively shield said MEMS device from at least one of EM energy incident to said device package and leakage of EM energy from said device package.

7. The device package of claim 6, further comprising:
   a seal comprising at least one of a hermetic seal and a conductive seal; and
   said seal disposed substantially between said dielectric lid and said device die.

8. The device package of claim 7, wherein:
   said EM energy comprises RF energy; and
   said seal comprises solder.

9. The device package of claim 8, wherein:
said metal layer comprises TiW; and
at least one of said solder seal and said TiW layer are connected to ground.

10. The device package of claim 9, wherein:
said connection to ground comprises a device common ground connection through an interconnect of said device substrate; and
said MEMS device comprises an RF MEMS switch.

11. A MEMS device array package, comprising:
an array of device dies, each die comprising a MEMS device;
an array of dielectrics lids; said lid array suitably adapted for effectively enclosing said MEMS devices; and wherein said dielectric lids include conductive layers;
an array of seals;
said seals disposed substantially between said dielectric lids and said device dies to form an array of discretely sealed MEMS device elements in a package array; and
said dielectric lids suitably adapted to effectively shield said MEMS devices from at least one of EM energy incident to said sealed MEMS devices and leakage of EM energy from said sealed MEMS devices.

12. The array package of claim 11, wherein:
said EM energy comprises RF energy;
said dielectric lid comprises an array of RF shielding regions;
said RF shielding regions comprising a conductive layer wherein the surface areas of the RF shielding regions effectively correspond to the surface areas of the MEMS device dies; and
said RF shielding regions are substantially aligned with said device dies.

13. The array package of claim 12, wherein at least one of said seals and said RF shielding regions are connected to ground.

14. The array package of claim 13, wherein:
said connections to ground comprise device common ground connections through an interconnect of said device dies; and
said MEMS devices comprise RF MEMS switches.

15. A method for MEMS device packaging, comprising the steps of:
providing a device die comprising a MEMS device;
providing a dielectric lid;
said dielectric lid comprising at least one of: an insulating layer and a conductive layer;
said dielectric lid suitably adapted to effectively shield said MEMS device from at least one of EM energy incident to said device package and leakage of EM energy from said device package: and
hermetically sealing said dielectric lid to said device die so as to form a substantially enclosed MEMS device package.

16. The method for MEMS device packaging of claim 15, wherein:
said insulating layer comprises at least one of GaAs, silicon, quartz, glass, sapphire and ceramic;
said conductive layer comprises at least one of Ag, Al, Au, Cr, Cu, Hf, Mo, Nb, Ni, Pb, Pd, Sn, Ta, Ti, V, W, Zr, a metal and a metal alloy;
said hermetic seal further comprises a conductive seal;
at least one of said conductive seal and said conductive layer are connected to a device common ground;
said EM energy comprises RF energy; and
said MEMS device comprises an RF MEMS switch.

17. A method for MEMS device wafer level packaging, comprising the steps of:
providing at least an array of device dies, each die comprising at least one MEMS device;
providing an array of dielectric lids wherein said dielectric lid array elements comprise at least one of: an insulating layer and a conductive layer;
providing at least an array of seals, each of said seals disposed substantially annularly around each of said MEMS devices in said die array such that each of said device die elements is substantially peripherally bounded by at least one of said seals;
hermetically sealing said dielectric lid to said device die array elements so as to form discretely sealed MEMS device elements in a wafer package array; and
said dielectric lid suitably adapted to substantially shield said MEMS devices from at least one of EM energy incident to said sealed MEMS device elements and leakage of EM energy from said sealed MEMS device elements.

18. The method for MEMS device wafer level packaging of claim 17, wherein:
said insulating layer comprises at least one of GaAs, silicon, quartz, glass, sapphire and ceramic;
said conductive layer comprises at least one of Ag, Al, Au, Cr, Cu, Hf, Mo, Nb, Ni, Pb, Pd, Sn, Ta, Ti, V, W, Zr, a metal and a metal alloy;
said hermetic seal further comprises a conductive seal;
at least one of said conductive seal and said conductive layer are connected to a device common ground;
said EM energy comprises RF energy; and
said MEMS device comprises an RF MEMS switch.

19. The method for MEMS device wafer level packaging of claim 17, wherein:
said dielectric lid further comprises an array of EM shielding regions;
the surface area of said EM shielding region array elements effectively corresponding to the surface area of said device die array elements; and
said method for wafer level packaging further comprising the step of substantially aligning said EM shielding array elements with said device die array elements substantially prior to sealing said dielectric lid to said device die array.

20. A method for making an EM shielding package lid suitable for wafer level MEMS device packaging, comprising the steps of:
providing a dielectric lid substrate;
depositing a shielding metal layer over said substrate; wherein said shielding metal layer substantially shields EM energy;
depositing at least one layer of photoresist over said metal layer;
patterning said photoresist to at least partially expose a window to one of said metal layers;
electroplating at least a solder wettable material into said exposed window;
at least one of: electroplating solder over said solder wettable metal and stripping said photoresist to substantially expose at least a portion of a metal layer;
at least one of: stripping said photoresist to substantially expose at least a portion of a metal layer and etching an exposed metal layer; and at least one of: optionally etching an exposed metal layer and depositing solder over said solder wettable metal.

21. The method for making an EM shielding package lid of claim 20, wherein said insulating substrate is at least one of GaAs, silicon, quartz, glass, sapphire and ceramic.

22. The method for making an EM shielding package lid of claim 20, wherein said metal layer comprises at least one of Al, Au, Cr, Cu, Pb, Sn, Ti, W, a metal and a metal alloy.

23. The method for making an EM shielding package lid of claim 20, wherein said patterning of said photoresist is accomplished photolithographically.

24. The method for making an EM shielding package lid of claim 20, wherein said solder wettable material comprises at least one of Cu and Au.

25. The method for making an EM shielding package lid of claim 20, wherein said solder comprises at least one of Cu, Pb and Sn.

26. A method for MEMS device packaging, comprising the steps of:
 providing a plurality of MEMS devices;
 providing a substrate with an array of device die recesses; said device recesses annularly defined by peripheral frames, said device recesses suitably adapted for disposing said MEMS devices therein;
 providing an array of dielectric lids comprising an insulating substrate with at least an array or cells;
 said insulating substrate cell array defining a plurality of EM shielding lid regions, said substrate cell array lid regions further comprising an array of peripheral frames; depositing at least one metal film layer over said insulating substrate;
 lithographically processing said insulating substrate to expose said lid region peripheral frames;
 depositing a solder-wettable material to a desired thickness over at least one of said device cell peripheral frames and lid region peripheral frames;
 depositing solder to a desired thickness over said solder-wettable material;
 aligning at least one of said wafer cell array and said insulating substrate array; and reflowing said solder to seal said device die cells to said lid cells.

27. The method for MEMS device packaging of claim 26, further comprising the step of dicing sealed device elements.

28. The method for MEMS device packaging of claim 26, further comprising the step of grounding at least one of said solder seal and said metal film.

29. The method for MEMS device packaging of claim 28, wherein:
 said insulating layer comprises at least one of GaAs, silicon, quartz, glass, sapphire and ceramic;
 said metal film comprises at least one of Al, Au, Cr, Cu, Pb, Sn, Ti, W, a metal and a metal alloy;
 said EM shielding comprises RF shielding;
 said MEMS device comprises an RF MEMS switch; and
 said grounding comprises conductive connection to a ground plane in at least one of a redistribution layer and a ground region in a multilayer ceramic structure.

* * * * *

UNITED STATES PATENT AND TRADEMARK OFFICE
CERTIFICATE OF CORRECTION

| | |
|---|---|
| PATENT NO. | : 6,953,985 B2 |
| APPLICATION NO. | : 10/170184 |
| DATED | : June 12, 2002 |
| INVENTOR(S) | : Jong-Kai Lin |

Page 1 of 1

It is certified that error appears in the above-identified patent and that said Letters Patent is hereby corrected as shown below:

In Column 24, Line 20, Claim No. 1:
 Change "engagement or said dielectric lid with said device" to --engagement of said dielectric lid with said device--

Signed and Sealed this

Twenty-fourth Day of June, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,953,985 B2 | Page 1 of 1 |
| APPLICATION NO. | : 10/170184 | |
| DATED | : October 11, 2005 | |
| INVENTOR(S) | : Jong-Kai Lin | |

It is certified that error appears in the above-identified patent and that said Letters Patent is hereby corrected as shown below:

In Column 24, Line 20, Claim No. 1:
    Change "engagement or said dielectric lid with said device" to --engagement of said dielectric lid with said device--

This certificate supersedes the Certificate of Correction issued June 24, 2008.

Signed and Sealed this

Twenty-second Day of July, 2008

JON W. DUDAS
*Director of the United States Patent and Trademark Office*